(12) United States Patent
Sano

(10) Patent No.: US 11,115,609 B2
(45) Date of Patent: Sep. 7, 2021

(54) SOLID-STATE IMAGING APPARATUS AND DRIVING METHOD THEREOF

(71) Applicant: Sony Semiconductor Solutions Corporation, Kanagawa (JP)

(72) Inventor: Fumiaki Sano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/890,207

(22) Filed: Jun. 2, 2020

(65) Prior Publication Data

US 2020/0322550 A1 Oct. 8, 2020

Related U.S. Application Data

(63) Continuation of application No. 16/479,843, filed as application No. PCT/JP2018/029162 on Aug. 3, 2018, now Pat. No. 10,750,104.

(30) Foreign Application Priority Data

Aug. 15, 2017 (JP) ................................ 2017-156746

(51) Int. Cl.
*H04N 5/351* (2011.01)
*H01L 27/146* (2006.01)
*H01L 31/107* (2006.01)

(52) U.S. Cl.
CPC ......... *H04N 5/351* (2013.01); *H01L 27/1461* (2013.01); *H01L 27/14647* (2013.01); *H01L 31/1075* (2013.01)

(58) Field of Classification Search
None
See application file for complete search history.

(56) References Cited

U.S. PATENT DOCUMENTS

2008/0283953 A1  11/2008  Itzler
2011/0174998 A1*  7/2011  Molnar ............... H01L 27/1446
                                                    250/550
(Continued)

FOREIGN PATENT DOCUMENTS

JP  2012-235265 A  11/2012
JP  2017-028690 A  2/2017
(Continued)

OTHER PUBLICATIONS

Written Opinion of the International Searching Authority dated Oct. 9, 2018, corresponding to International Application No. PCT/JP2018/029162 filed Aug. 3, 2018.

(Continued)

*Primary Examiner* — James M Hannett
(74) *Attorney, Agent, or Firm* — Michael Best & Friedrich LLP

(57) ABSTRACT

The present technology relates to a solid-state imaging apparatus and a driving method that can perform imaging at lower power consumption.

By providing the solid-state imaging apparatus including a pixel array section on which a plurality of SPAD pixels is two-dimensionally arranged, in which in a case where illuminance becomes first illuminance higher than reference illuminance, a part of the SPAD pixels of the plurality of pixels arranged on the pixel array section is thinned, it is possible to image at lower power consumption. The present technology can be applied to an image sensor, for example.

14 Claims, 17 Drawing Sheets

(56) References Cited

U.S. PATENT DOCUMENTS

2015/0054111 A1    2/2015  Niclass et al.
2017/0018587 A1*  1/2017  Ohmaru ............ H01L 27/14665

FOREIGN PATENT DOCUMENTS

| WO | 2016/183091 A1 | 11/2016 |
| WO | 2017/094362 A1 | 6/2017 |
| WO | 2017/150391 A1 | 9/2017 |

OTHER PUBLICATIONS

Japanese Office Action dated Jul. 28, 2020 for corresponding Japanese Application No. 2019-536731.
Chinese Office Action dated Mar. 11, 2021 for corresponded Chinese Application No. 210880008273.7.

* cited by examiner

SOLID-STATE IMAGING APPARATUS AND DRIVING METHOD THEREOF

CROSS REFERENCES TO RELATED APPLICATIONS

The present application is a Continuation Application of U.S. patent application Ser. No. 16/479,843 filed Jul. 22, 2019, which is a 371 National Stage Entry of International Application No.: PCT/JP2018/029162, filed on Aug. 3, 2018, which in turn claims priority from Japanese Application No. 2017-156746, filed on Aug. 15, 2017, the entire contents of which are incorporated herein by reference.

TECHNICAL FIELD

The present technology relates to a solid-state imaging apparatus and a driving method thereof and, more particularly to, a solid-state imaging apparatus and a driving method thereof such that imaging can be performed with lower power consumption.

BACKGROUND ART

An SPAD (Single Photon Avalanche Diode) that is a photodiode technology having read-out sensitivity at one photon level by electronic multiplication (for example, see Patent Literature 1).

CITATION LIST

Patent Literature

Patent Literature 1: US 2015/0054111 A1

DISCLOSURE OF INVENTION

Technical Problem

Incidentally, the SPAD has a structure of an Avalanche section in a semiconductor so as to detect one photon, through which an electron photoelectrically converted from one photon passes, and the electron is multiplied tens of thousands times. Thus, the solid-state imaging apparatus using the SPAD pixels is suitable for imaging at a dark scene with a small amount of light.

On the other hand, in a case where the solid-state imaging apparatus using the SPAD pixels is used for imaging at a bright scene with a large amount of light, tens of thousands of photons are incident and multiplied, and hundreds of millions of electrons are generated. As a result, consumption power becomes extremely great, and it is therefore desirable to reduce the consumption power.

The present technology is made in view of the above-mentioned circumstances, and it is an object of the present technology to provide a solid-state imaging apparatus using SPAD pixels that can perform imaging at lower power consumption.

Solution to Problem

According to an aspect of the present technology, a solid-state imaging apparatus includes a pixel array section on which a plurality of SPAD (Single Photon Avalanche Diode) pixels is two-dimensionally arranged, in which in a case where illuminance becomes first illuminance higher than reference illuminance, a part of the SPAD pixels of the plurality of pixels arranged on the pixel array section is thinned.

According to an aspect of the present technology, a driving method of a solid-state imaging apparatus including a pixel array section on which a plurality of SPAD pixels is two-dimensionally arranged includes in a case where illuminance becomes first illuminance higher than reference illuminance, thinning a part of the SPAD pixels of the plurality of pixels arranged on the pixel array section.

In the solid-state imaging apparatus and the driving method according to an aspect of the present technology, in a case where illuminance becomes first illuminance higher than reference illuminance, thinning a part of the SPAD pixels of the plurality of pixels arranged on the pixel array section The solid-state imaging apparatus according to an aspect of the present technology may be an independent apparatus or may be an internal block configuring one apparatus.

Advantageous Effects of Invention

According to an aspect of the present technology, it is possible to image at lower power consumption.

It should be noted that the effects described here are not necessarily limitative and may be any of effects described in the present disclosure.

MODE(S) FOR CARRYING OUT THE INVENTION

Hereinafter, an embodiment of the present disclosure will be described with reference to the drawings.

The embodiments of the present technology will be described in the following order.
1. Configuration of solid-state imaging apparatus
2. Embodiments of the present technology
3. Modifications
4. Configuration of electronic device
5. Usage example of solid-state imaging apparatus
6. Application example for mobile body <1. Configuration of Solid-State Imaging Apparatus>

(Configuration Example of Solid-State Imaging Apparatus)

Figure 1:
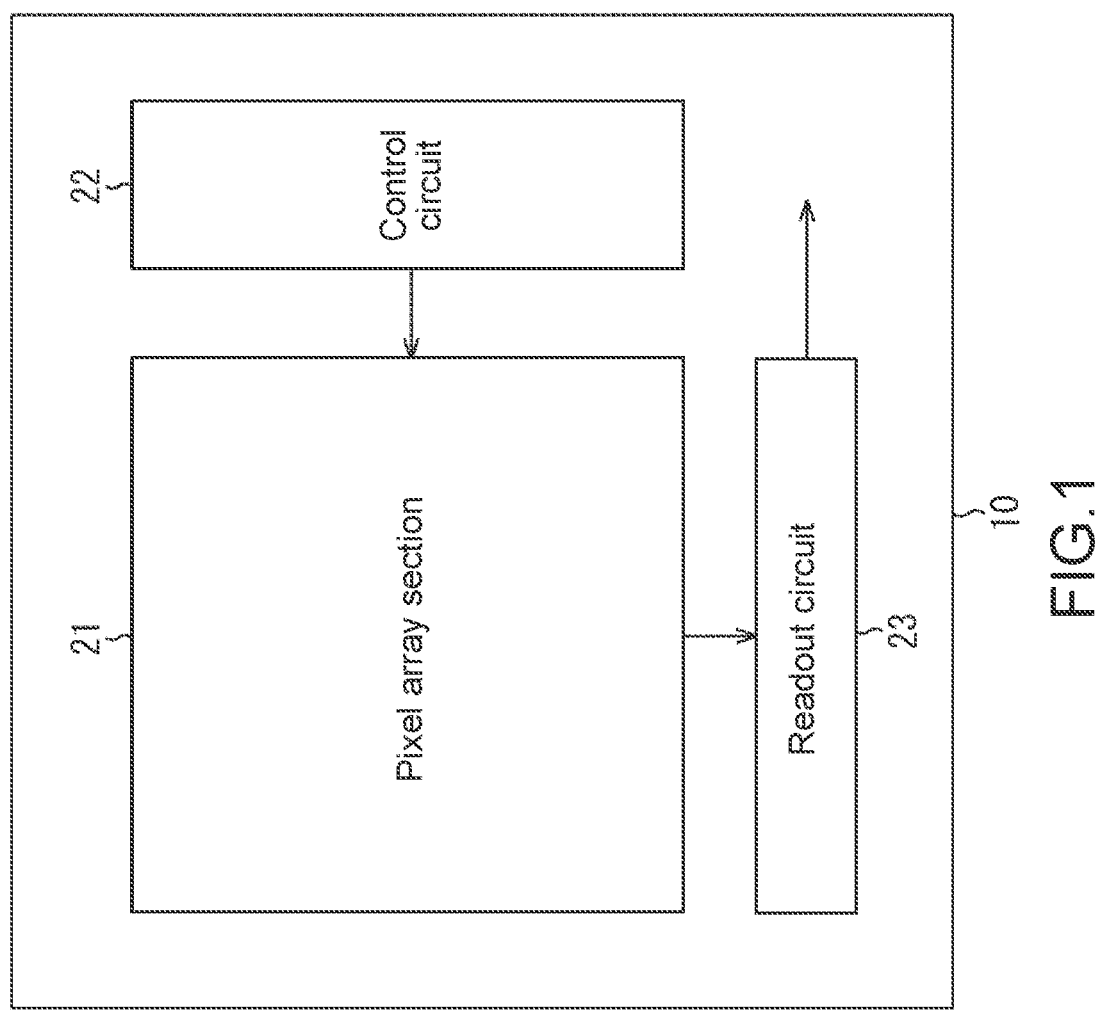
FIG. 1 is a block diagram showing a configuration example of an embodiment of a solid-state imaging apparatus to which the present technology is applied.

FIG. 1 is a block diagram showing a configuration example of an embodiment of a solid-state imaging apparatus to which the present technology is applied.

A solid-state imaging apparatus 10 is an image sensor that receives incoming light from an object to be imaged, converting an amount of the incoming light imaged on an imaging surface into an electric signal for each pixel unit, and outputting it as a pixel signal.

In FIG. 1, the solid-state imaging apparatus 10 includes a pixel array section 21, a control circuit 22, and a readout circuit 23.

In the pixel array section 21, a plurality of SPAD (Single Photon Avalanche Diode) pixels is two-dimensionally (matrix) arranged. Here, the SPAD pixel is a pixel including a single photon Avalanche photodiode (SPAD). This single photon Avalanche photodiode has a structure of an Avalanche section in a semiconductor so as to detect one photon, through which an electron photoelectrically converted from one photon passes, and the electron is multiplied (amplified) tens of thousands times.

The control circuit 22 controls an operation of each section of the solid-state imaging apparatus 10.

In addition, the control circuit 22 outputs a control signal (pulse) for driving the SPAD pixels via a pixel driving line, to thereby controlling the driving of the plurality of SPAD pixels two-dimensionally arranged on the pixel array section 21. For example, the control circuit 22 controls the driving of the plurality of SPAD pixels two-dimensionally arranged on the pixel array section 21 on the basis of a detection result of illuminance.

The readout circuit 23 successively scans the plurality of SPAD pixels two-dimensionally arranged on the pixel array section 21 and reads out the pixel signal generated by each SPAD pixel via a signal line. The readout circuit 23 outputs the read out pixel signal to a signal processing section (not shown) at a latter part.

The solid-state imaging apparatus 10 is configured as described above.

<2. Embodiments of the Present Technology>

Incidentally, the solid-state imaging apparatus 10 has the pixel array section 21 on which the plurality of SPAD pixels two-dimensionally arranged. At the time of imaging in a bright place, tens of thousands of photons are incident and multiplied, for example, to thereby generating hundreds of millions of electrons. Therefore, it is desirable to reduce consumption power. According to the present technology, the consumption power is reduced by the following methods.

Specifically, in the solid-state imaging apparatus 10, in a case where illuminance is higher than reference illuminance, a part of the SPAD pixels are thinned from the plurality of SPAD pixels arranged on the pixel array section 21. Thus, imaging can be performed at lower power consumption.

Note that illuminance can be classified into three stages of high illuminance, medium illuminance lower than the high illuminance, and low illuminance lower than the medium illuminance, for example, depending on a threshold value. Specifically, for example, the high illuminance is set to about 10,000 lux, the medium illuminance is set to about 1,000 lux, and the low illuminance is set to about 0.01 lux.

Also, for example, the illuminance can be classified into two stages of the high illuminance and the low illuminance lower than the high illuminance, for example, depending on the threshold value. In other words, the illuminance is classified into plural stages of illuminance depending on the threshold value.

First Example of Driving SPAD Pixels

Figure 2:
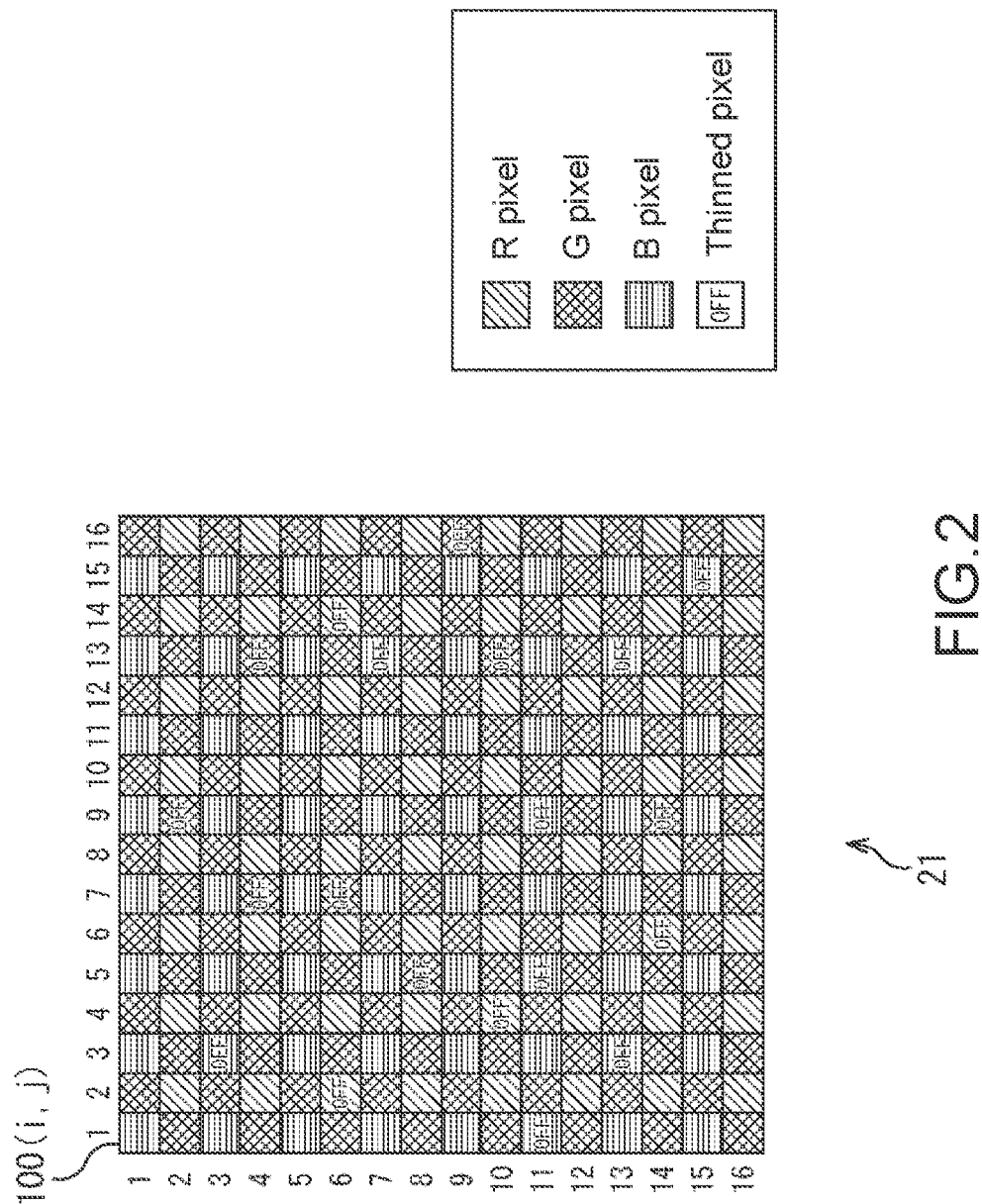
FIG. 2 is a diagram showing a first example of driving a plurality of SPAD pixels arranged on a pixel array section.

FIG. 2 shows a first example of driving the plurality of SPAD pixels arranged on the pixel array section 21 of FIG. 1.

FIG. 2 shows pixels in 16 rows and 16 columns arranged at an upper left region seen, for example, from a light incident side among a plurality of SPAD pixels 100 two-dimensionally arranged on the pixel array section 21.

Note that each row number and each column number corresponding to i row and j column of the SPAD pixels 100 are denoted at a left side region and an upper side region in FIG. 2. In the following description, the i row and the j column of the plurality of SPAD pixels 100 arranged on the pixel array section 21 denote the SPAD pixel 100 (i, j).

In addition, as a color filter, a red (R) color filter is arranged. The pixel that receives the pixel signal corresponding to light of a red (R) component from the light transmitted through the R color filter is denoted as an R pixel.

Similarly, the pixel that receives the pixel signal corresponding to light of a green (G) component from the light transmitted through a green (G) color filter is denoted as a G pixel. Also, the pixel that receives the pixel signal corresponding to light of a blue (B) component from the light transmitted through a blue (B) color filter is denoted as a B pixel.

Specifically, in the pixel array section 21, the plurality of SPAD pixels 100 is two-dimensionally and regularly arranged as the R pixels, the G pixels, or the B pixels to form a Bayer array. Note that the Bayer array is an arrangement pattern that the G pixels are arranged in a checkered pattern and the R pixels and the B pixels are arranged alternately for one column in the remaining parts.

Here, in the pixel array section 21, a SPAD pixel 100 (3, 3) is looked. This SPAD pixel 100 (3, 3) is the B pixel and also a thinned pixel to which a letter "OFF" is added.

The thinned pixels are pixels thinning among a plurality of SPAD pixels 100 two-dimensionally arranged on the pixel array section 21 at the time of the high illuminance. The SPAD pixel 100 (3, 3) becomes the thinned pixel in accordance with a driving control from the control circuit 22 at the time of the high illuminance.

In the pixel array section 21, a SPAD 100 (2, 9), a SPAD pixel 100 (4, 7), a SPAD pixel 100 (4, 13), a SPAD pixel 100 (6, 2), a SPAD pixel 100 (6, 7), a SPAD pixel 100 (6, 14), a SPAD pixel 100 (7, 13), and a SPAD pixel 100 (8, 5) are set to the thinned pixels similar to the SPAD pixel 100 (3, 3).

Furthermore, in the pixel array section 21, a SPAD pixel 100 (9, 16), a SPAD pixel 100 (10, 4), a SPAD pixel 100 (10, 13), a SPAD pixel 100 (11, 1), a SPAD pixel 100 (11, 5), a SPAD pixel 100 (11, 9), a SPAD pixel 100 (13, 3), a SPAD pixel 100 (13, 13), a SPAD pixel 100 (14, 6), a SPAD pixel 100 (14, 9), and a SPAD pixel 100 (15, 15) are set to the thinned pixels similar to the SPAD pixel 100 (3, 3).

Thus, in the pixel array section 21, any SPAD pixels 100 among the plurality of SPAD pixels 100 are set to the thinned pixels irregularly (randomly) for each pixel unit at the time of the high illuminance. Then, since a part of the SPAD pixels 100 among the plurality of SPAD pixels 100 two-dimensionally arranged on the pixel array section 21 is thinned for each pixel unit at the time of the high illuminance, the power consumption can be reduced.

Note that the pixel signal corresponding to the position of the thinned pixel can be acquired by performing predetermined signal processing (e.g., correction processing), for example, on a signal processing circuit at a latter part using the image signal acquired from the pixels surrounding the thinned pixel.

Second Example of Driving SPAD Pixels

FIG. 2 shows a second example of driving the plurality of SPAD pixels arranged on the pixel array section 21 of FIG. 1.

Figure 3:
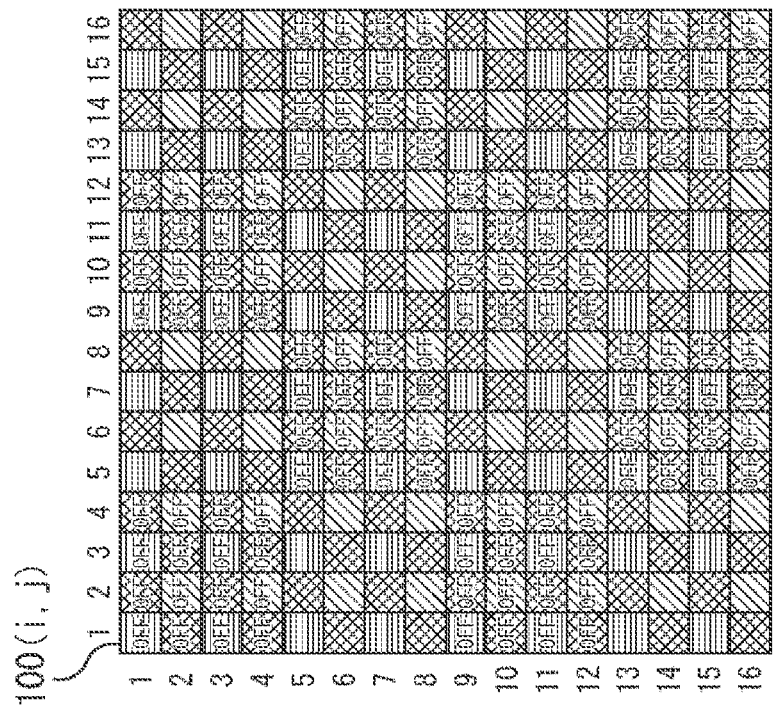
FIG. 3 is a diagram showing a second example of driving a plurality of SPAD pixels arranged on a pixel array section.

In the pixel array section 21 of FIG. 3, similar to the pixel array section 21 shown in FIG. 2, the plurality of SPAD pixels 100 is two-dimensionally and regularly arranged as the R pixels, the G pixels, or the B pixels to form a Bayer array.

Also, in the pixel array section 21 of FIG. 3, a part of the SPAD pixels 100 among the plurality of SPAD pixels 100 is thinned. However, the thinned pixels are arranged not for each pixel unit but for each block unit including the plurality of pixels.

For example, in the pixel array section 21, one block is configured by the SPAD pixels 100 having 4×4 pixels of the SPAD pixels 100 (1, 1) to 100 (1, 4), the SPAD pixels 100 (2, 1) to 100 (2, 4), the SPAD pixels 100 (3, 1) to 100 (3, 4), and the SPAD pixels 100 (4, 1) to 100 (4, 4). The SPAD pixels 100 in the block become the thinned pixels at the time of the high illuminance.

In addition, for example, in the pixel array section 21, one block is configured by the SPAD pixels 100 having 4×4 pixels of the SPAD pixels 100 (1, 5) to 100 (1, 8), the SPAD pixels 100 (2, 5) to 100 (2, 8), the SPAD pixels 100 (3, 5) to 100 (3, 8), and the SPAD pixels 100 (4, 5) to 100 (4, 8). The SPAD pixels 100 in the block are general pixels and become any of the R pixels, the G pixels, or the B pixels even at the time of the high illuminance.

Similarly, in the pixel array section 21, for 4×4 pixels block, a first block including the general SPAD pixels 100 and a second block including the SPAD pixels 100 that become the thinned pixels at the time of the high illuminance are repeated alternately in the column direction and the row direction.

Thus, in the pixel array section 21, any SPAD pixels 100 among the plurality of SPAD pixels 100 become the thinned pixels regularly for each block unit at the time of the high illuminance. Then, since a part of the SPAD pixels 100 among the plurality of SPAD pixels 100 two-dimensionally arranged on the pixel array section 21 is thinned for each block unit at the time of the high illuminance, the power consumption can be reduced.

First Example of Structure of SPAD Pixel

Figure 4:
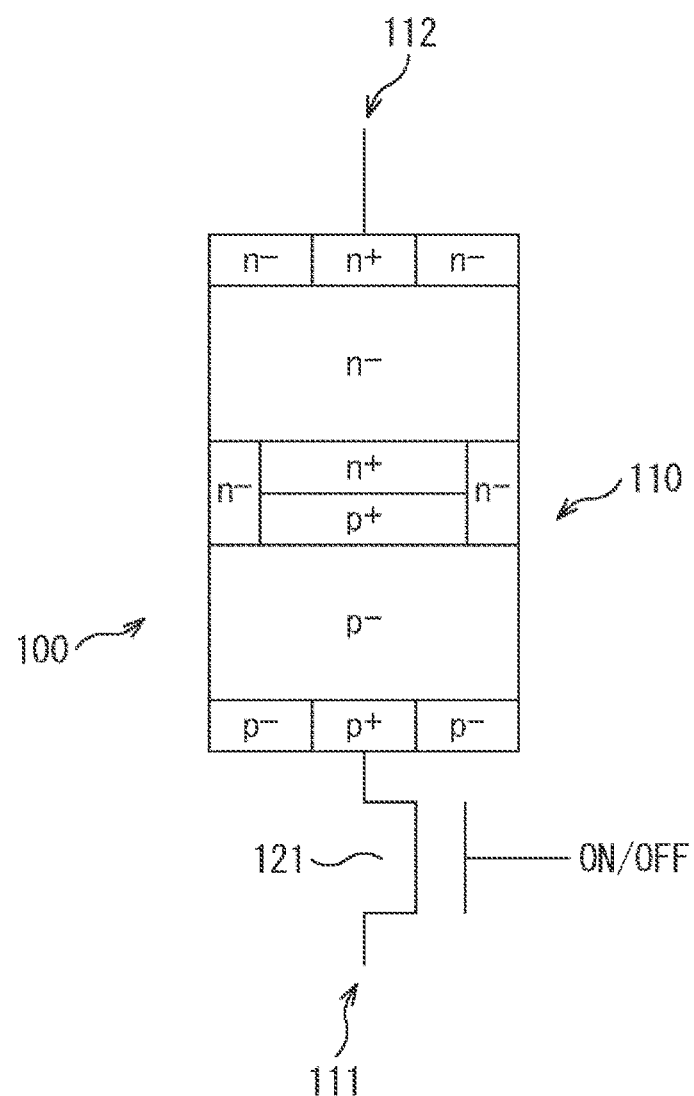
FIG. 4 is a cross-sectional view showing a first example of a structure of the SPAD pixel.

FIG. 4 is a cross-sectional view showing a first example of a structure of the SPAD pixel 100.

In a single photon Avalanche photodiode 110 of the SPAD pixel 100 in FIG. 4, a voltage for generating Avalanche multiplication, for example, on an anode 111 or a cathode 112. A pn junction between an n-well receiving the incoming light and a p+ diffusion layer causes the Avalanche multiplication to be generated.

In the single photon Avalanche photodiode 110, a transistor 121 is connected to the anode 111. A driving signal from the control circuit 22 is input to a gate of the transistor 121 to control on/off of the transistor 121.

By the control circuit 22, if the luminance is low or medium other than the high illuminance, the driving signal at a predetermined level is allowed to be inputted to the gate of the transistor 121 with respect to the SPAD pixel 100 that becomes the thinned pixel at the time of the high illuminance. Thus, a target SPAD pixel 100 is driven as the R pixel, the G pixel, or the B pixel.

In addition, by the control circuit 22, if the luminance is high, the driving signal at the predetermined level is allowed to be inputted to the gate of the transistor 121 with respect to the SPAD pixel 100 that becomes the thinned pixel at the time of the high illuminance. Thus, the target SPAD pixel 100 becomes the thinned pixel.

Note that, by the control circuit 22, the driving signal at the predetermined level is allowed to be inputted to the gate of the transistor 121 with respect to the SPAD pixel 100 that becomes the general pixel. Thus, irrespective of the high illuminance, the medium illuminance, or the low illuminance, the target SPAD pixel 100 is always driven as the R pixel, the G pixel, or the B pixel.

Thus, in the SPAD pixel 100, the transistor 121 is connected to the anode 111 of the single photon Avalanche photodiode 110 and its voltage is controlled. It will be thus possible to thin a part of the SPAD pixel 100 among the plurality of SPAD pixels arranged on the pixel array section 21 at the time of the high illuminance for each pixel unit or each block unit.

Second Example of Structure of SPAD Pixel

Figure 5:
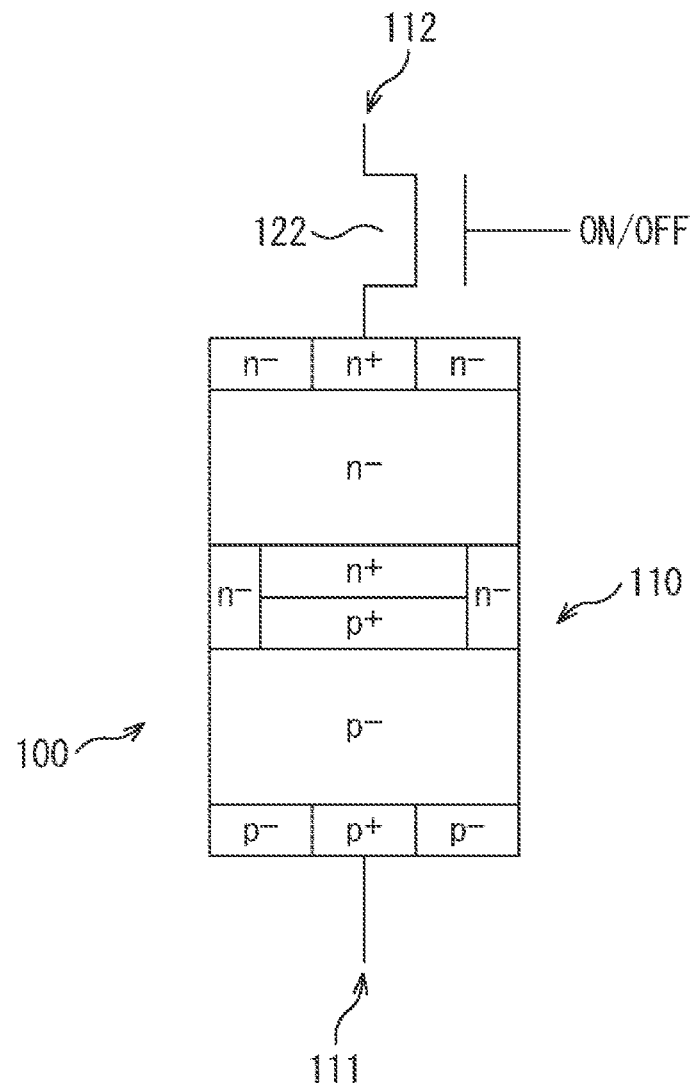
FIG. 5 is a cross-sectional view showing a second example of a structure of the SPAD pixel.

FIG. 5 is a cross-sectional view showing a second example of the structure of the SPAD pixel 100.

In the SPAD pixel 100 of FIG. 5, a transistor 122 is connected to the cathode 112 of the single photon Avalanche photodiode 110. A driving signal from the control circuit 22 is input to a gate of the transistor 122 to control on/off of the transistor 122.

Thus, in the SPAD pixel 100, the transistor 122 is connected to the cathode 112 of the single photon Avalanche photodiode 110 and its voltage is controlled. It will be thus possible to thin a part of the SPAD pixel 100 among the plurality of SPAD pixels arranged on the pixel array section 21 at the time of the high illuminance for each pixel unit or each block unit.

Third Example of Structure of SPAD Pixel

Figure 6:
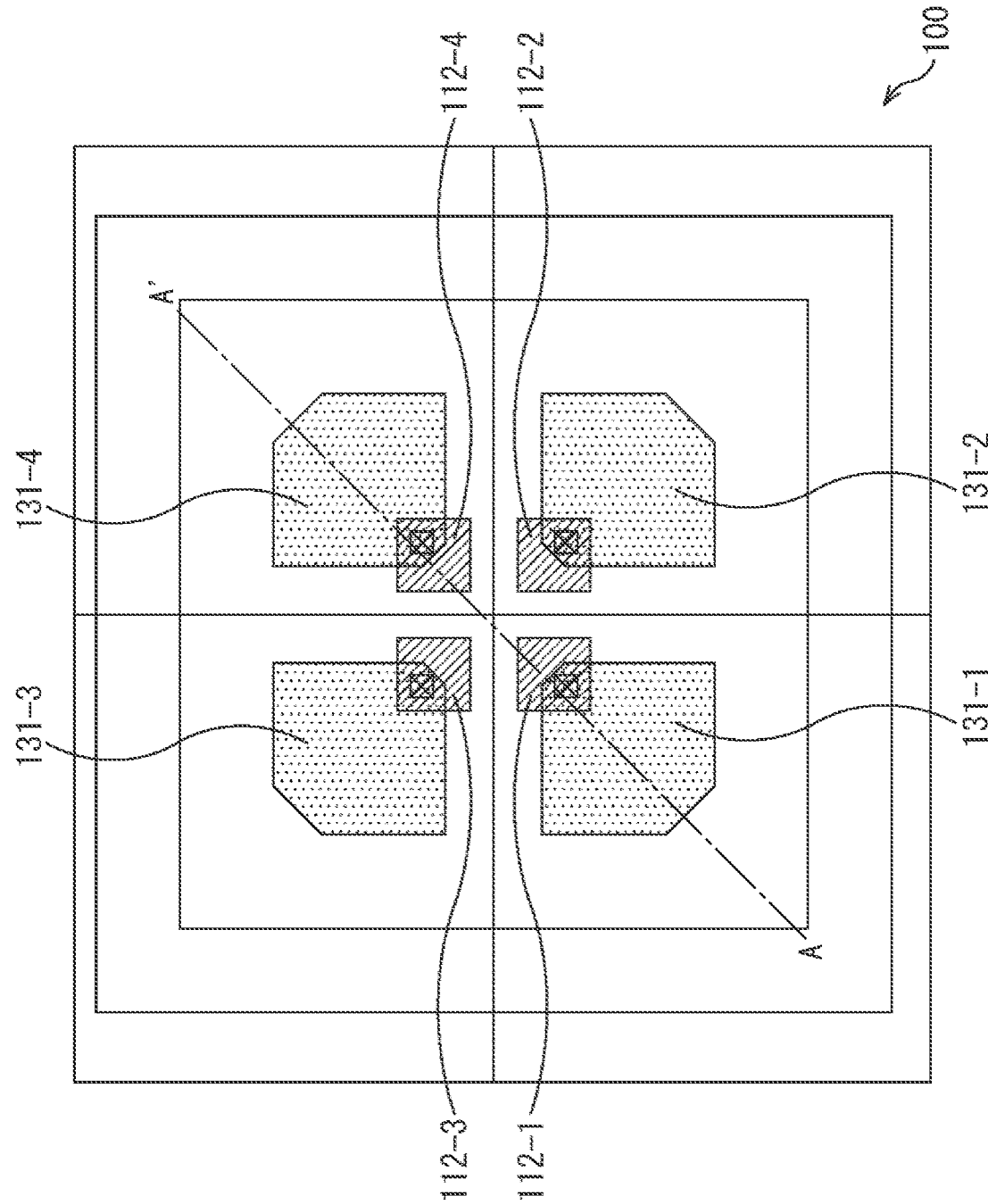
FIG. 6 is a plan view showing a third example of a structure of the SPAD pixel.

FIG. 6 is a plan view showing a third example of the structure of the SPAD pixel 100.

The SPAD pixel 100 of FIG. 6 has the structure that an Avalanche section 131 that is a multiplication region of the single photon Avalanche photodiode 110 is divided into plural and the anode 111 and the cathode 112 are connected to each of the divided Avalanche section 131.

Here, the Avalanche section 131 is divided into four to form divided Avalanche sections 131-1 to 131-4 and cathodes 112-1 to 112-4 are connected to the respective divided Avalanche sections 131-1 to 131-4, respectively.

Figure 7:
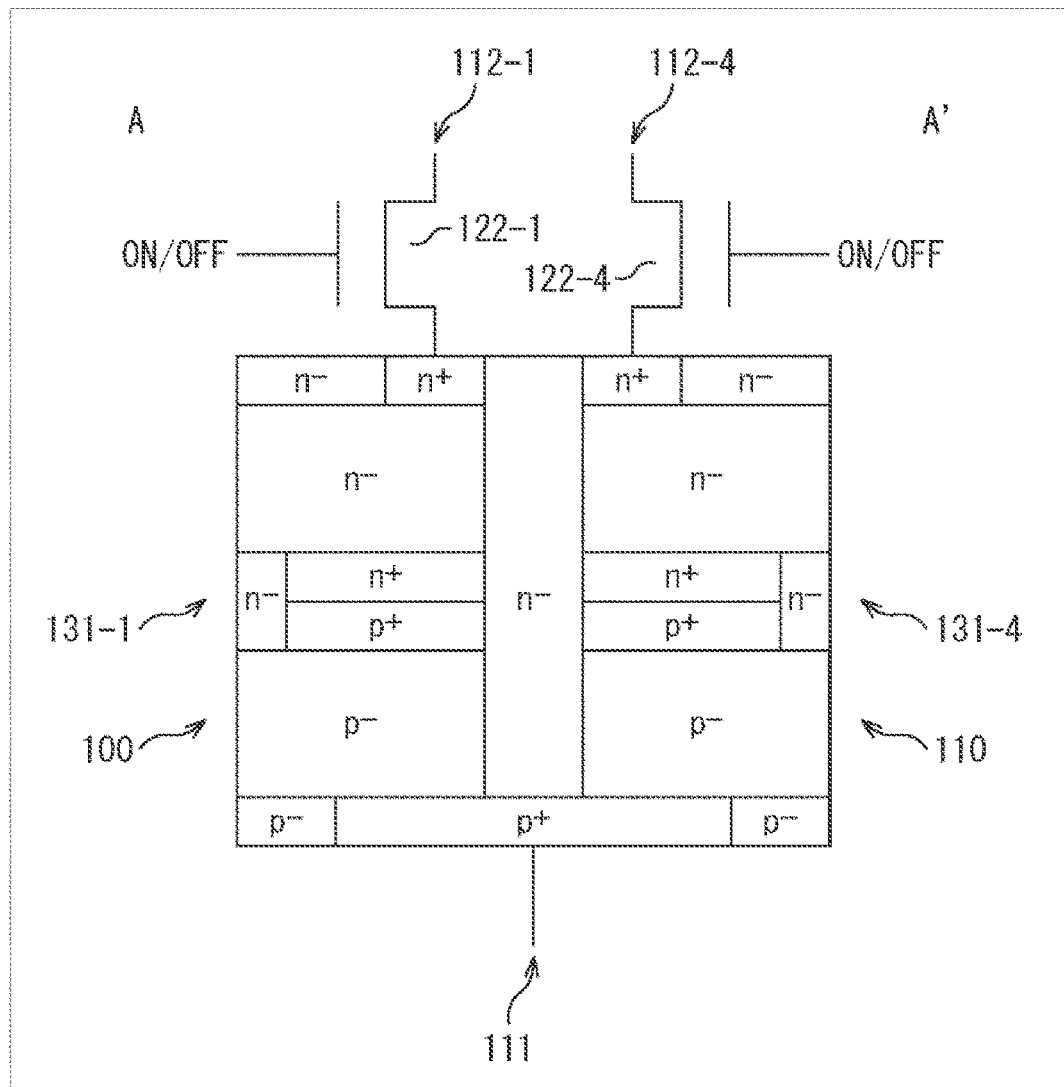
FIG. 7 is a cross-sectional view showing a third example of a structure of the SPAD pixel.

FIG. 7 shows a cross-sectional view taken along the line A-A' of FIG. 6 showing the third example of the structure of the SPAD pixel 100.

In the single photon Avalanche photodiode 110 of FIG. 7, the cathode 112-1 is connected to the divided Avalanche section 131-1. A transistor 122-1 is connected to the cathode 112-1 and an on/off operation is controlled in accordance with the driving signal from the control circuit 22.

On the other hand, a cathode 112-4 is connected to the divided Avalanche section 131-4. A transistor 122-4 is connected to the cathode 112-4 and the on/off operation is controlled in accordance with the driving signal from the control circuit 22.

By the control circuit 22, if the luminance is high, the driving signal at the predetermined level is allowed to be inputted to the gates of the transistors 122-1 to 122-41 with respect to the SPAD pixel 100 that becomes the thinned pixel at the time of the high illuminance. Thus, the target SPAD pixel 100 becomes the thinned pixel.

At this time, in the SPAD pixel 100, the driving signal at the predetermined level is allowed to be inputted to each of the gates of the transistors 122-1 to 122-4, to thereby controlling the driving for each of the divided Avalanche sections 131-1 to 131-4.

For example, at the time of the low illuminance or the medium illuminance, all four divided Avalanche sections of the divided Avalanche sections 131-1 to 131-4 are used (i.e., utilization rate at this time equals to "4/4"). However, at the high illuminance, only three divided Avalanche sections of the divided Avalanche sections 131-1 to 131-4 are used (i.e., utilization rate at this time equals to "3/4").

Note that such a thinning control for each divided Avalanche section unit may be performed on all of the plurality of SPAD pixels 100 arranged on the pixel array section 21, or may be performed on only a part of the SPAD pixels 100.

Thus, in a case where the Avalanche section 131 of the SPAD pixel 100 is divided into plural, the transistors 122-1 to 122-4 are connected to the cathodes 112-1 to 112-4 of the respective divided Avalanche sections 131-1 to 131-4 and its voltage is controlled. It will be thus possible to thin a part of the SPAD pixel 100 among the plurality of SPAD pixels arranged on the pixel array section 21 at the time of the high illuminance for each divided pixel unit (divided Avalanche section unit).

Fourth Example of Structure of SPAD Pixel

Figure 8:
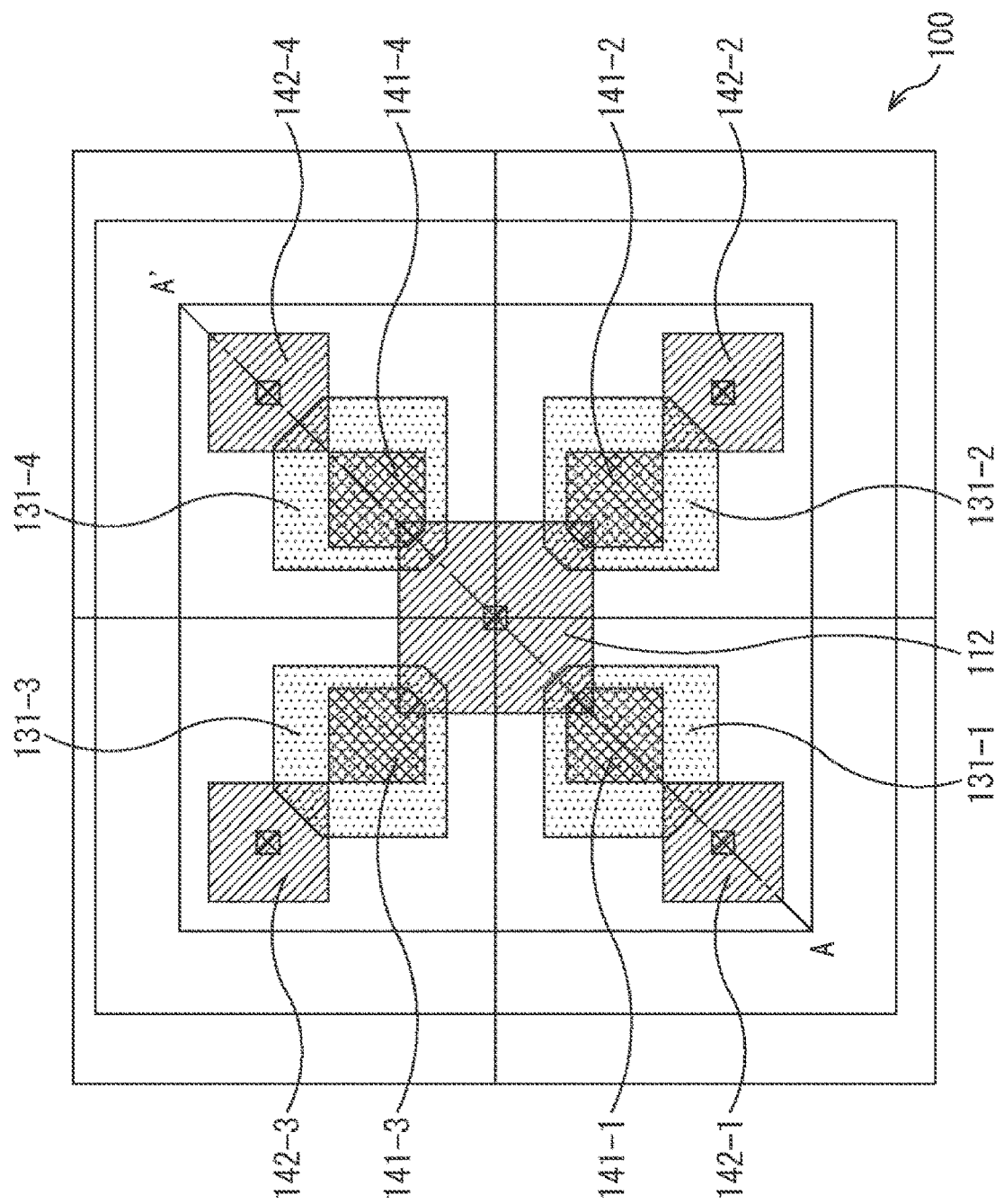
FIG. 8 is a plan view showing a fourth example of a structure of the SPAD pixel.

FIG. 8 is a plan view showing a fourth example of the structure of the SPAD pixel 100.

Similar to the third example described above, the SPAD pixel 100 of FIG. 8 has the structure that the Avalanche section 131 is divided into four and the anode 111 and the cathode 112 are connected to the Avalanche sections 131-1 to 131-4.

Figure 9:
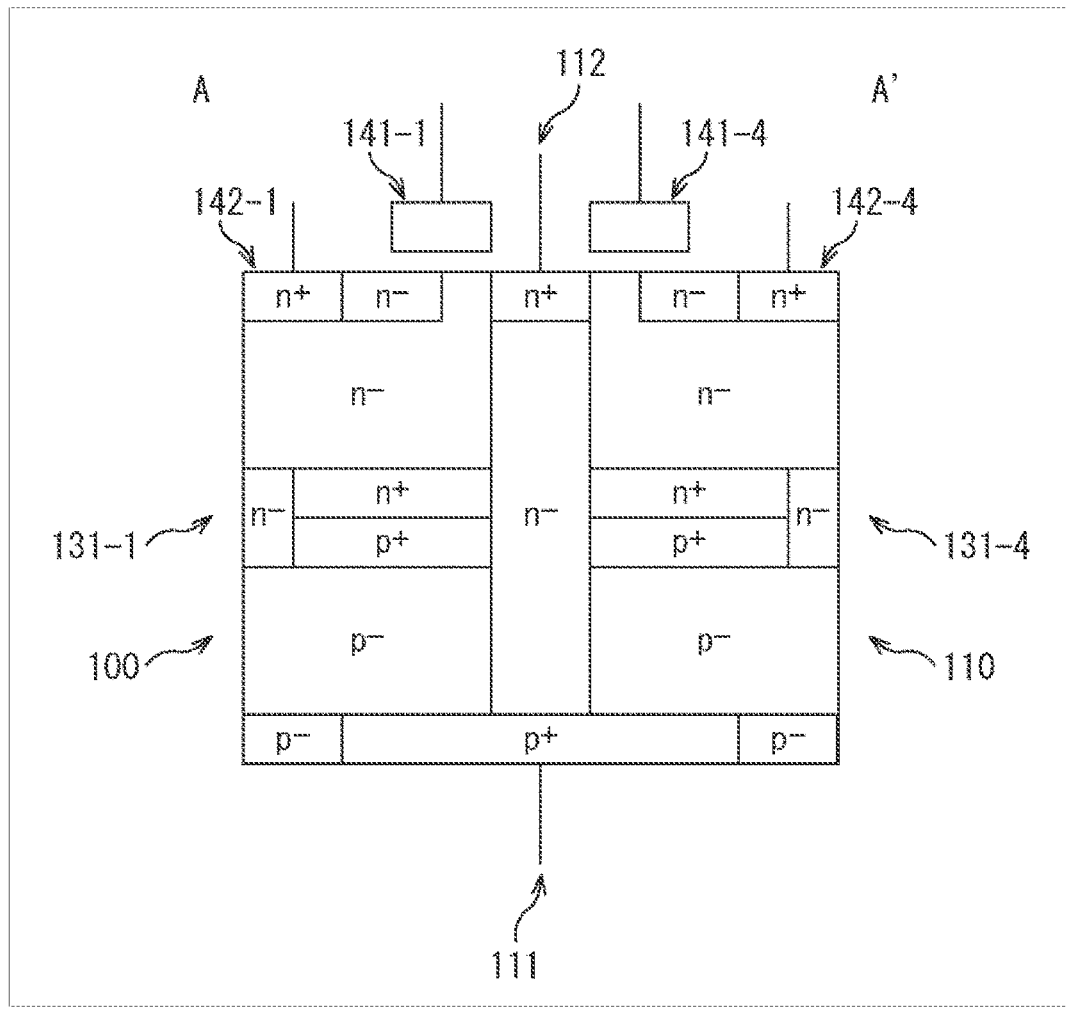
FIG. 9 is a cross-sectional view showing a fourth example of a structure of the SPAD pixel.

FIG. 9 shows a cross-sectional view taken along the line A-A' of FIG. 8 showing the fourth example of the structure of the SPAD pixel 100.

In the single photon Avalanche photodiode 110 of FIG. 9, the cathode 112-1 is connected to the divided Avalanche section 131-1. In addition, a gate electrode 141-1 is arranged so as to cover a part of an upper part of the divided Avalanche section 131-1.

Here, a wiring contact is connected to the upper part of the gate electrode 141-1. The gate electrode 141-1 performs the on/off operation in accordance with the driving signal applied via the contact such that electrons are transferred from the divided Avalanche section 131-1 to the cathode 112.

An overflow drain (OFD: Overflow Drain) 142-1 is configured to be capable of discharging unnecessary electrons such that the electrons are not leaked to the Avalanche section 131 adjacent (for example, divided Avalanche sections 131-2 to 131-4) when the gate electrode 141-1 is turned off.

On the other hand, the cathode 112 is connected to and a gate electrode 141-4 and an overflow drain 142-4 are arranged on the divided Avalanche section 131-4. The gate electrode 141-4 performs the on/off operation in accordance with the driving signal applied via the contact such that electrons are transferred from the divided Avalanche section 131-4 to the cathode 112.

By the control circuit 22, if the luminance is high, the driving signal at the predetermined level is allowed to be applied to the gate electrodes 141-1 to 141-4 with respect to the SPAD pixel 100 that becomes the thinned pixel at the time of the high illuminance. Thus, the target SPAD pixel 100 becomes the thinned pixel.

At this time, in the SPAD pixel 100, the driving signal at the predetermined level is allowed to be inputted to each of the gate electrodes 141-1 to 141-4, to thereby controlling the driving for each of the divided Avalanche sections 131-1 to 131-4.

For example, at the time of the low illuminance or the medium illuminance, all four divided Avalanche sections of the divided Avalanche sections 131-1 to 131-4 are used (i.e., utilization rate at this time equals to "4/4"). However, at the high illuminance, only one divided Avalanche section of the divided Avalanche sections 131-1 to 131-4 is used (i.e., utilization rate at this time equals to "1/4").

Note that such a thinning control for each divided Avalanche section unit may be performed on all of the plurality of SPAD pixels 100 arranged on the pixel array section 21, or may be performed on only a part of the SPAD pixels 100.

Thus, in a case where the Avalanche section 131 of the SPAD pixel 100 is divided into plural, the gate electrodes 141-1 to 141-4 are arranged with respect to the cathode 112 and the respective divided Avalanche sections 131-1 to 131-4 connected thereto and its voltage is controlled. It will be thus possible to thin a part of the SPAD pixel 100 among the plurality of SPAD pixels arranged on the pixel array section 21 at the time of the high illuminance for each divided pixel unit (divided Avalanche section unit).

(Example of Driving by Using Avalanche Probability)

Figure 10:
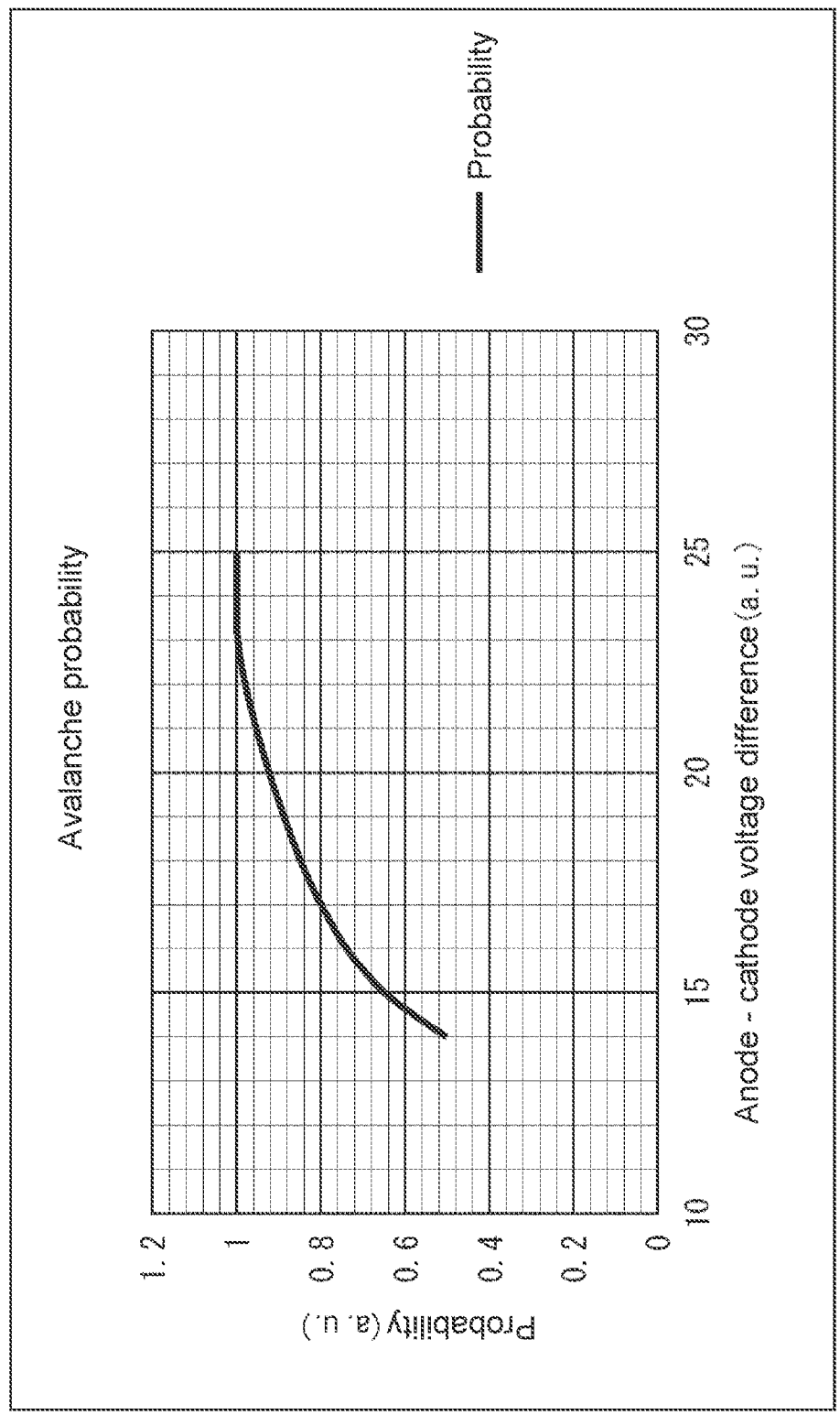
FIG. 10 is a diagram showing an example of an Avalanche probability by a voltage difference between an anode and a cathode of the SPAD.

FIG. 10 is a diagram showing an example of an Avalanche probability by a voltage difference between an anode and a cathode of the single photon Avalanche photodiode 110.

In FIG. 10, the horizontal axis represents the voltage difference between the anode and the cathode and the vertical axis represents the Avalanche probability.

As shown in FIG. 10, the smaller voltage difference between the anode and the cathode is, the lower the Avalanche probability is. On the other hand, the larger the voltage difference between the anode and the cathode is, the higher Avalanche probability is.

In other words, when the voltage difference between the anode and the cathode is sufficiently large, all electrons can generate the Avalanche multiplication, for example. However, when the voltage difference becomes small, the number of the electrons that generates the Avalanche multiplication becomes about half, for example.

Here, the voltage difference between the anode and the cathode is controlled such that the Avalanche probability is 100% at the low illuminance, for example. On the other hand, the voltage difference between the anode and the cathode is controlled such that the Avalanche probability is decreased at the time of the high illuminance. Thus, it will be possible to perform imaging at lower power consumption at the time of the high illuminance.

(Flow of SPAD Pixel Driving Control Processing)

Figure 11:
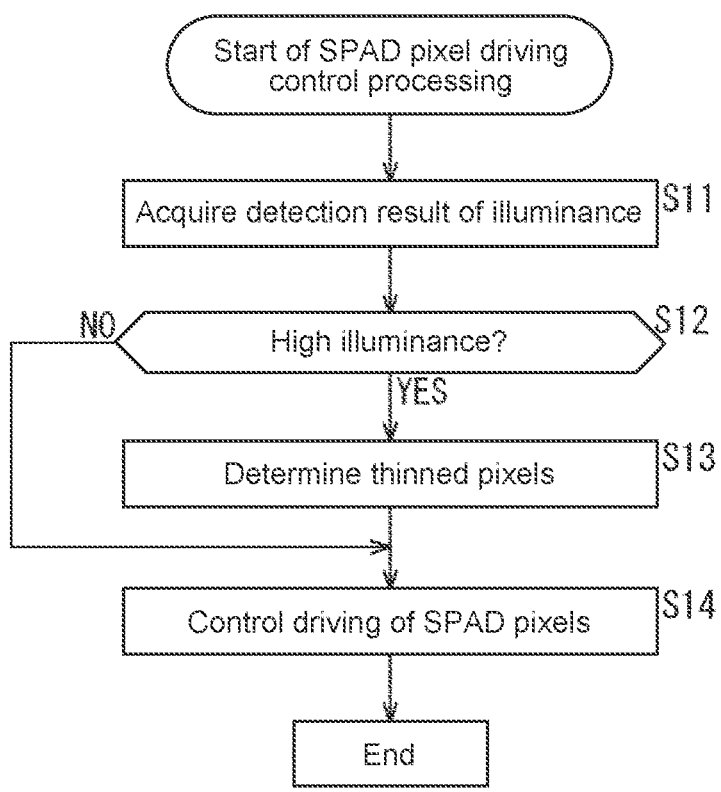
FIG. 11 is a flowchart of explaining a flow of SPAD pixel driving control processing.

Next, with reference to a flowchart of FIG. 11, a flow of SPAD pixel driving control processing executed by the control circuit 22 will be described.

In Step S11, the control circuit 22 acquires a detection result of the illuminance.

Here, as a method of detecting the illuminance, a variety of detection method can be employed. For example, the detection result of the illuminance can be acquired from an analysis result of the image acquired from an output from an illuminance sensor or an output of the solid-state imaging apparatus 10 (for example, whether or not image is too bright to be saturated, etc.) or the like.

In Step S12, the control circuit 22 determines whether or not the illuminance is high by comparing the detection result of the illuminance to the threshold value on the basis of the detection result of the illuminance acquired in the processing of Step S11.

Note that in determination processing, the detection result of the illuminance can be determined, for example, by three stages of high illuminance, medium illuminance, and low illuminance, or by two stages of high illuminance or low illuminance depending on the threshold value.

In Step S12, in a case where it is determined it is the high illuminance, the processing proceeds to Step S13. In Step S13, the control circuit 22 determines the thinned pixels.

Here, for example, the control circuit 22 determines which unit such as the pixel unit, the block unit, and the divided Avalanche section unit thins a part of the SPAD pixels 100 among the plurality of SPAD pixels 100 arranged on the pixel array section 21 on the basis of preset information and the like, and further determines which of the SPAD pixels 100 is the actual thinned pixel.

In other words, here, it can also be said that valid SPAD pixels 100 and invalid SPAD pixels 100 are determined respectively at the time of the high illuminance among the plurality of SPAD pixels 100 arranged on the pixel array section 21.

After the processing in Step S13 is ended, the processing proceeds to processing in Step S14. Note that in Step S12, in a case where the illuminance is determined as low or medium and not high, the processing in Step S13 is skipped, and the processing proceeds to processing in Step S14.

In Step S14, the control circuit 22 controls the driving of the plurality of SPAD pixels 100 arranged on the pixel array section 21.

Here, since the information about the unit for thinning and the thinned pixel is determined by the processing in Step S13 at the time of the high illuminance, the control circuit 22 can control the driving of the plurality of SPAD pixels 100 arranged on the pixel array section 21 on the basis of the information, for example.

The flow of the SPAD pixel driving control processing has been described above.

In the SPAD pixel driving control processing, since it becomes possible to thin a part of the SPAD pixels 100 among the plurality of SPAD pixels 100 arranged on the pixel array section 21 at the time of the high illuminance for a predetermined unit (e.g., pixel unit, block unit, or divided Avalanche section unit), imaging can be performed at lower power consumption.

<3. Modifications>

(Other Examples of Structure of SPAD Pixel)

Figure 12:
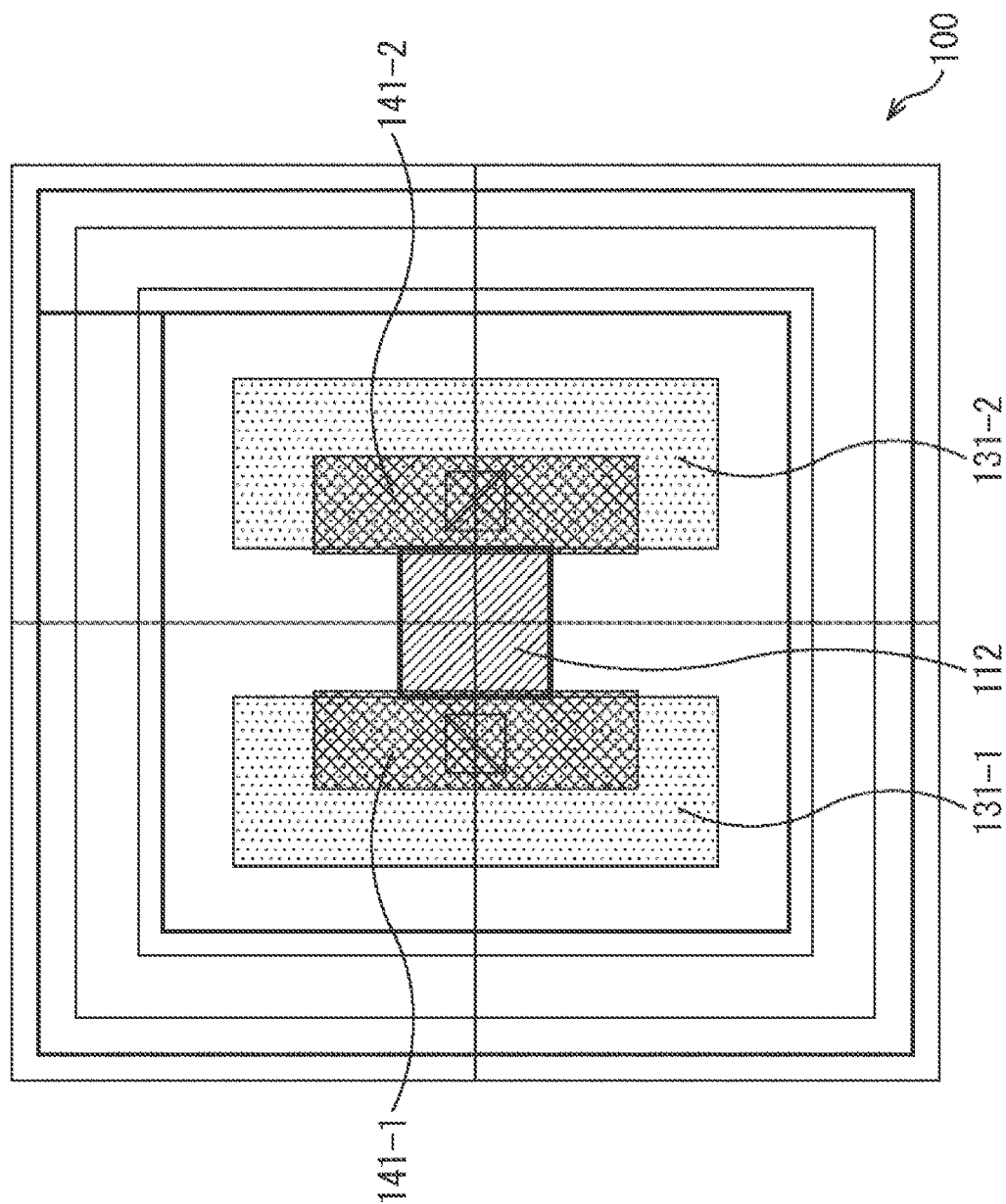
FIG. 12 is a plan view showing other example of a structure of the SPAD pixel.

FIG. 12 is a plan view showing other example of the structure of the SPAD pixel 100.

In the above description, it shows the structure of the Avalanche section 131 of the SPAD pixel 100 divided into four. Any division number may be used by dividing the Avalanche section 131. For example, if the Avalanche section 131 is divided into two, the structure is as shown in FIG. 12.

Specifically, in FIG. 12, the Avalanche section 131 is divided into two, the divided Avalanche section 131-1 and the divided Avalanche section 131-2 are formed. Here, similar to the above-described fourth example, the gate electrode 141-1 is arranged on the divided Avalanche section 131-1 and the gate electrode 141-2 is arranged on the divided Avalanche section 131-2, to thereby thinning a part of the SPAD pixels 100 for each divided pixel unit (divided Avalanche section unit).

Note that the division number of the Avalanche section 131 is exemplified by four and two. The division number is arbitrary and may be divided into three, eight, ten, hundred, or the like.

Figure 13:
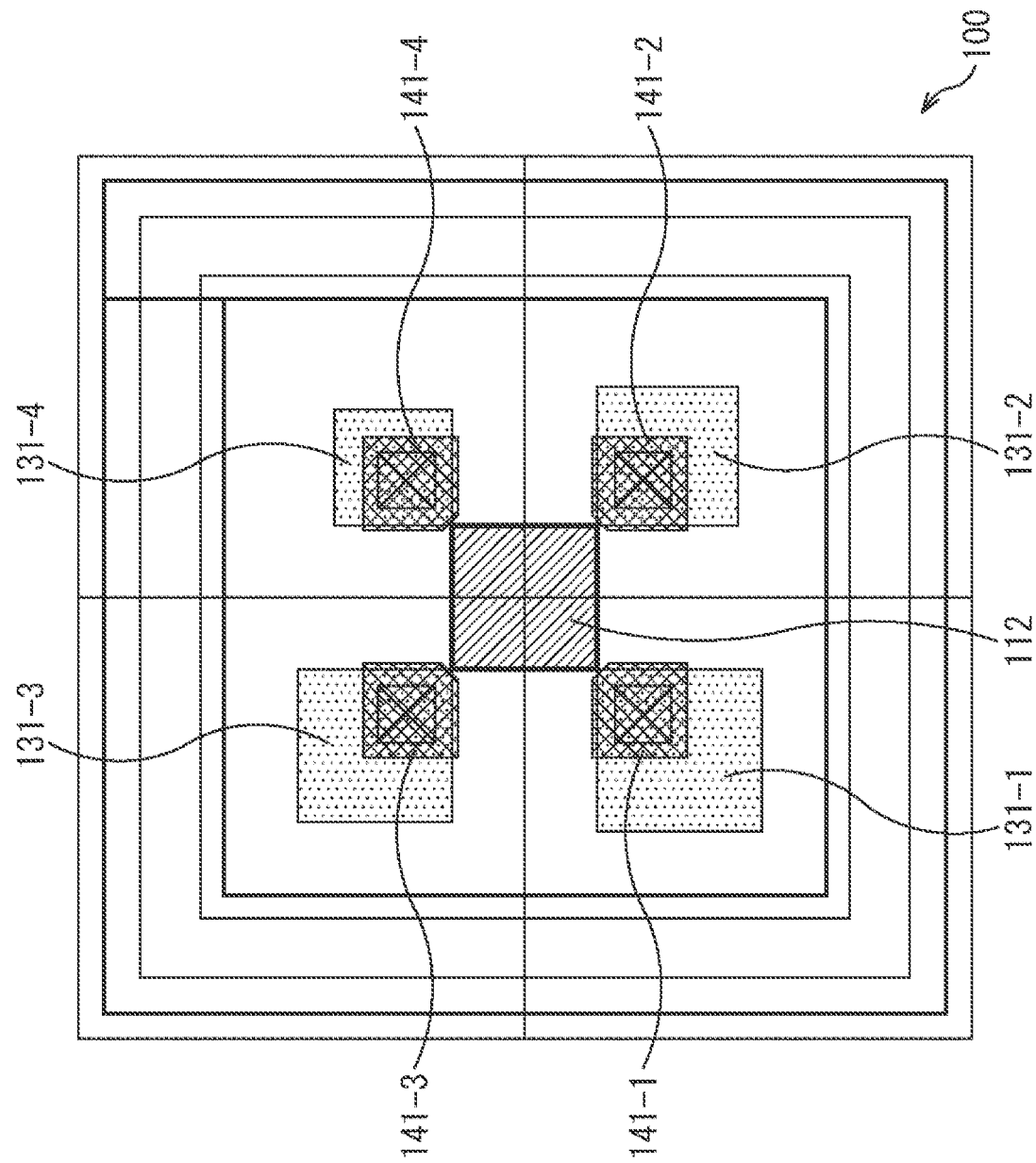
FIG. 13 is a plan view showing other example of a structure of the SPAD pixel.

FIG. 13 is a plan view showing still other example of the structure of the SPAD pixel 100.

The above description illustrates that the Avalanche section 131 of the SPAD pixel 100 is divided into four such that region areas of the divided Avalanche sections 131-1 to 131-4 are almost the same. However, respective region areas of the divided Avalanche sections 131-1 to 131-4 may be different.

For example, as shown in FIG. 13, in the SPAD pixel 100, the divided Avalanche section 131-1 has the largest area, and the divided Avalanche section 131-3, the divided Avalanche section 131-2, and the divided Avalanche section 131-4 have smaller areas in this order.

Also, here, similar to the above-described fourth example, the gate electrode 141-1 to gate electrode 141-4 are arranged on the divided Avalanche section 131-1 to 131-4, to thereby thinning a part of the SPAD pixels 100 for each divided pixel unit (divided Avalanche section unit).

Note that, in the structures of the SPAD pixels 100 shown in FIG. 12 and FIG. 13, similar to the above-described fourth example, an overflow drain 142 may be arranged. In addition, as the structures of the SPAD pixels 100 shown in FIG. 12 and FIG. 13, similar to the third example, each of the divided Avalanche sections 131-N (N: integer of 1 or more) may be connected to different cathode 112-N.

Other Example of Driving SPAD Pixel

In the above description, when any SPAD pixels of the plurality of SPAD pixels 100 in the pixel array section 21 shown in FIG. 2 irregularly (randomly) become the thinned pixels for each pixel unit at the time of the high illuminance, the consumption power can be reduced. Here, it is not limited that the pixels are irregularly thinned for each pixel unit but the pixels may be regularly thinned for each pixel unit.

According to the above description, in the pixel array section 21 shown in FIG. 3, when any SPAD pixels 100 among the plurality of SPAD pixels 100 become the thinned pixels regularly for each block unit at the time of the high illuminance, the power consumption can be reduced. Here, it is not limited that the pixels are regularly thinned for each block unit but the pixels may be irregularly (randomly) thinned for each block unit.

Furthermore, the number of the pixels thinned (thinned pixels) from the plurality of SPAD pixels 100 arranged on the pixel array section 21 is arbitrary at the time of the high illuminance.

Other Examples of Cross-Sectional Structure of SPAD Pixel

In the single photon Avalanche photodiode 110, an anode can be formed at a side of a first surface that is a light incident surface or at a side of a second surface opposite to the first surface, and a cathode can be formed at a side of the second surface or a side of the first side. In other words, the anode and the cathode of the single photon Avalanche photodiode 110 may be arranged on surfaces of a semiconductor or may be arranged on a front surface and a rear surface, for example.

Other Examples of Sensor

The above description illustrates an image sensor (for example, CMOS (Complementary Metal Oxide Semiconductor) image sensor) for acquiring image data as the solid-state imaging apparatus 10. However, it may be used as other sensor such as a distance sensor (for example, sensor of measuring distance by TOF (Time of Flight) method).

Other Examples of Arrangement Pattern of SPAD Pixel

In the above description, the Bayer array is illustrated as the arrangement pattern of the plurality of SPAD pixels 100 arranged on the pixel array section 21. However, other arrangement patterns may be employed. In addition, it illustrates that the SPAD pixels 100 are the R pixels, the G pixels, or the B pixels. However, for example, it may include W pixels of white (W), IR pixels of infrared rays (IR), or the like.

Other Examples of Control Circuit

The above-description illustrates that the control circuit 22 controls the driving of the plurality of SPAD pixels 100 arranged on the pixel array section 21. However, an external device different from the solid-state imaging apparatus 10 may control the driving of the SPAD pixels 100. Thus, other measures may control the driving of the SPAD pixels 100.

<4. Configuration of Electronic Device>

Figure 14:
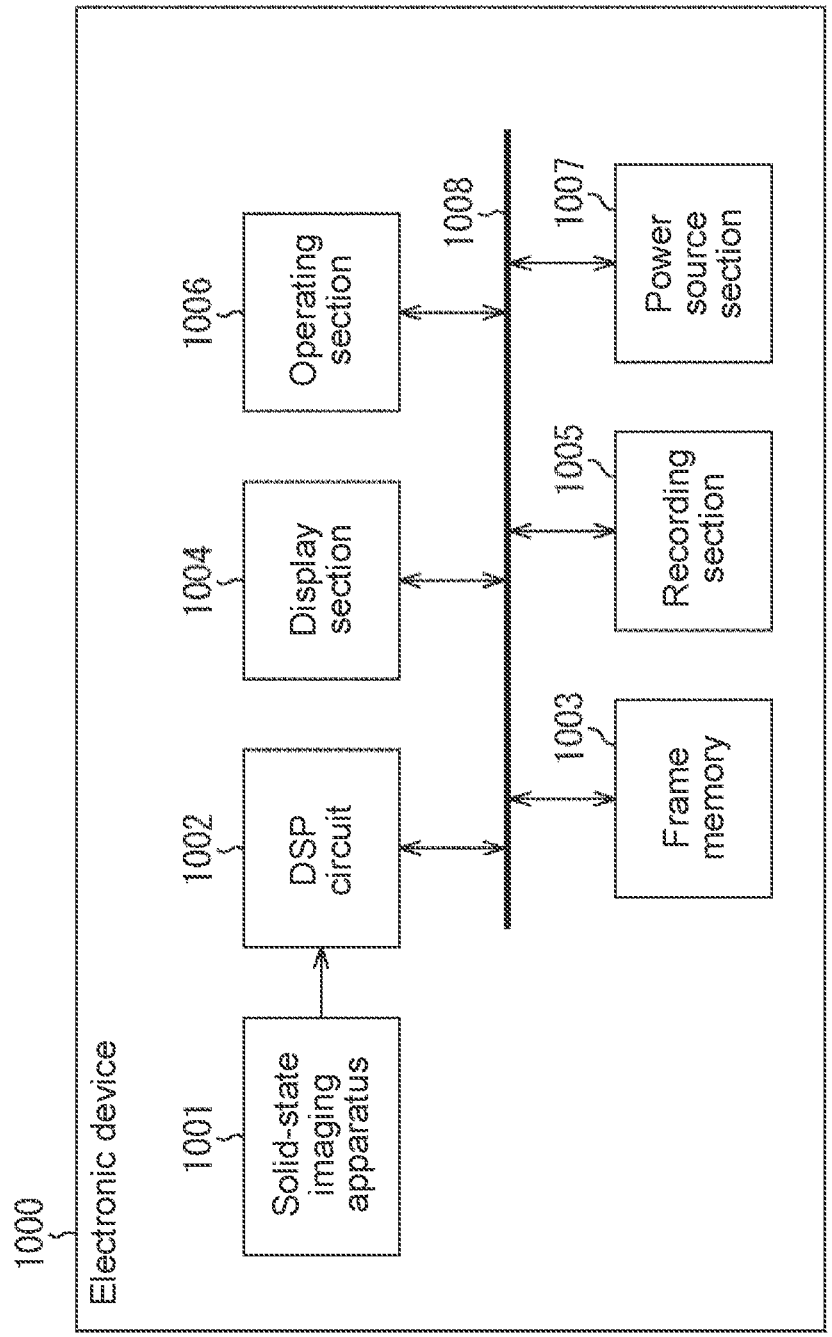
FIG. 14 is a block diagram showing a configuration example of an electronic device including the solid-state imaging apparatus to which the present technology is applied.

FIG. 14 is a block diagram showing a configuration example of an electronic device including the solid-state imaging apparatus to which the present technology is applied.

The electronic device 1000 is an imaging device such as a digital still camera and a video camera, a mobile terminal device such as a smartphone and a tablet type terminal, and the like.

The electronic device 1000 includes a solid-state imaging apparatus 1001, a DSP circuit 1002, a frame memory 1003, a display section 1004, a recording section 1005, an operating section 1006, and a power supply section 1007. In addition, in the electronic device 1000, the DSP circuit 1002, the frame memory 1003, the display section 1004, the recording section 1005, the operating section 1006, and the power supply section 1007 are connected each other via a bus line 1008.

The solid-state imaging apparatus 1001 corresponds to the above-described solid-state imaging apparatus 10 (FIG. 1), the structure of the plurality of SPAD pixels two-dimensionally arranged on the pixel array section 21 (FIG. 1) employs the above-described structures (for example, first to fourth examples of structures of SPAD pixels 100), and driving thereof can be controlled by the above-described driving (for example, first example to second example of driving SPAD pixels 100).

The DSP circuit 1002 is a camera signal processing circuit that process a signal fed from the solid-state imaging apparatus 1001. The DSP circuit 1002 outputs image data acquired by processing the signal from the solid-state imaging apparatus 1001. The frame memory 1003 temporarily holds the image data processed by the DSP circuit 1002 for each frame unit.

The display section 1004 includes a panel type display device such as a liquid crystal panel and an organic EL (Electro Luminescence) panel, and displays moving images or still images imaged by the solid-state imaging apparatus 1001. The recording section 1005 records the image data of the moving images or the still images imaged by the solid-state imaging apparatus 1001 on a recording medium such as a semiconductor memory and a hard disc.

The operating section 1006 outputs operation commands concerning a variety of functions included in the electronic device 1000 in accordance with an operation by a user. The power supply section 1007 feeds a variety of power sources for operating power sources of the DSP circuit 1002, the frame memory 1003, the display section 1004, the recording section 1005, and the operating section 1006 to objects to be fed, as appropriate.

The electronic device 1000 is configured as described above. The present technology is applied to the solid-state imaging apparatus 1001 as described above. Specifically, the solid-state imaging apparatus 10 (FIG. 1) is applicable to the solid-state imaging apparatus 1001. By applying the present technology to the solid-state imaging apparatus 1001, since a part of the SPAD pixels 100 among the plurality of SPAD pixels 100 arranged on the pixel array section 21 is thinned at the time of the high illuminance for a predetermined unit (e.g., pixel unit, block unit, or divided Avalanche section unit), imaging can be performed at lower power consumption.

<5. Usage Example of Solid-State Imaging Apparatus>

Figure 15:
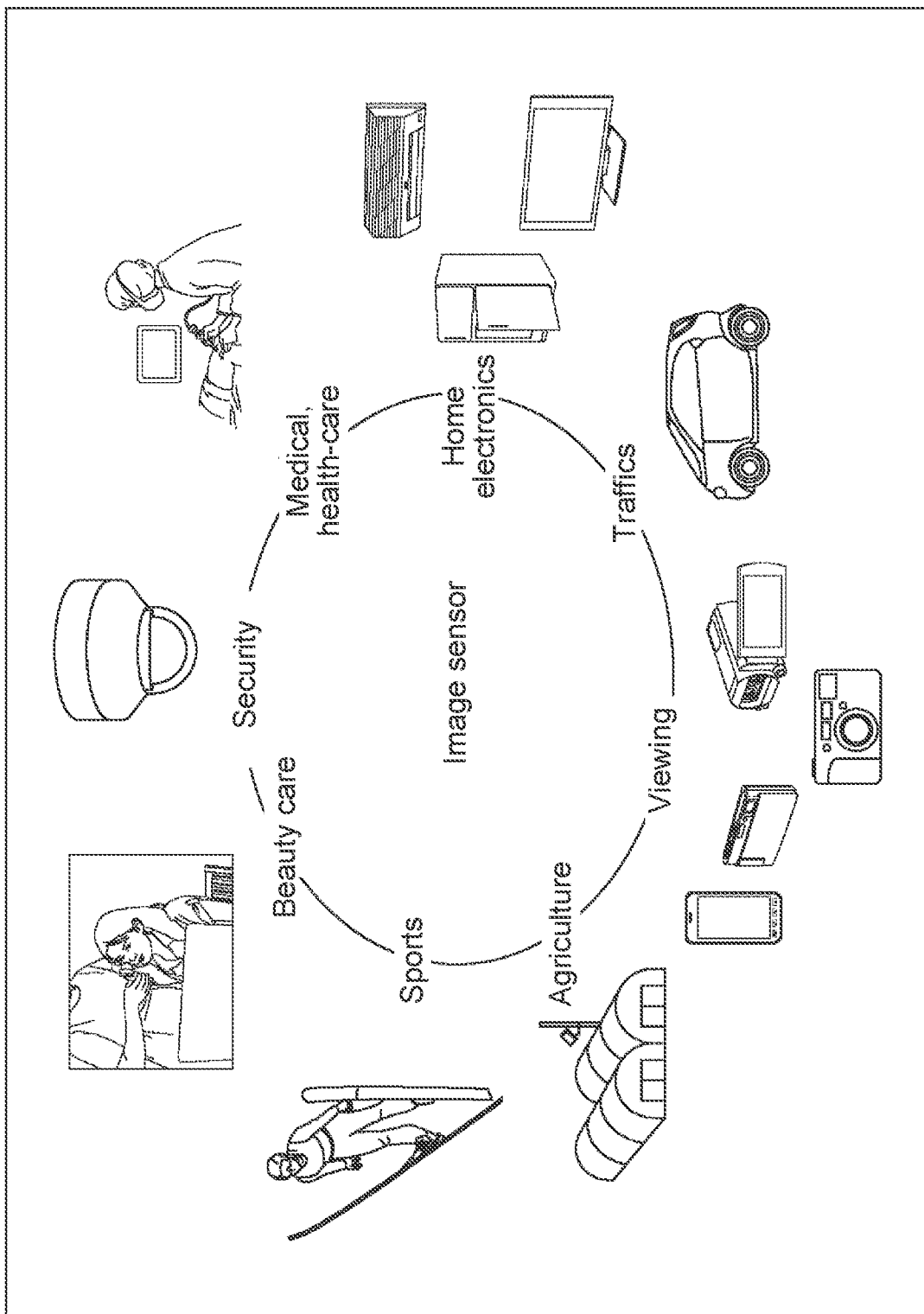
FIG. 15 is a diagram showing a usage example of the solid-state imaging apparatus to which the present technology is applied.

FIG. 15 is a diagram showing a usage example of the solid-state imaging apparatus to which the present technology is applied.

The solid-state imaging apparatus 10 (FIG. 1) can be used in various cases of sensing light such as visible light, infrared light, ultraviolet light, and X-rays as follows. Specifically, as shown in FIG. 15, solid-state imaging apparatus 10 can be used in apparatuses not only in the field of viewing in which images to be viewed are photographed, but also, for example, in the field of traffics, the field of home electronics, the field of medical, health-care, the field of security, the field of beauty care, the field of sports, the field of agriculture, or the like.

Specifically, in the field of viewing, for example, the solid-state imaging apparatus 10 can be used in an apparatus of photographing the images to be viewed (for example, electronic device 1000 of FIG. 14) such as a digital camera, a smartphone, and a mobile phone with a camera function.

In the field of traffics, for example, the solid-state imaging apparatus 10 can be used in an apparatus used for traffic purposes such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver's state, and the like.

In the field of home electronics, for example, the solid-state imaging apparatus 10 can be used in an apparatus used in home electronics such as a TV, a refrigerator, and an air conditioner, for photographing gestures of users and executing apparatus operations according to the gestures. In addition, in the field of medical and health-care, for example, the solid-state imaging apparatus 10 can be used an apparatus used for medical and health-care purposes, such as an endoscope and an apparatus that performs blood vessel photographing by receiving infrared light.

In the field of security, for example, the solid-state imaging apparatus 10 can be used in an apparatus used for security purposes, such as a surveillance camera for crime-prevention purposes and a camera for person authentication purposes. In the field of beauty care, for example, the solid-state imaging apparatus 10 can be used in an apparatus used for beauty care purposes, such as a skin measurement apparatus that photographs skins and a microscope that photographs scalps.

In the field of sports, for example, the solid-state imaging apparatus 10 can be used in an apparatus used for sports purposes, such as an action camera and a wearable camera for sports purposes. In addition, in the field of agriculture, for example, the solid-state imaging apparatus 10 can be used in an apparatus for agriculture purposes, such as a camera for monitoring a state of fields and crops <6. Application Example for Mobile Body>

The technology of the present disclosure (the present technology) can be applied to a variety of products. For example, the technology of the present disclosure may be realized as a device included in any type of a mobile body such as an automobile, an electric automobile, a hybrid electric automobile, a motorcycle, a bicycle, personal mobility, an airplane, a drone, a ship, a robot, and the like.

Figure 16:
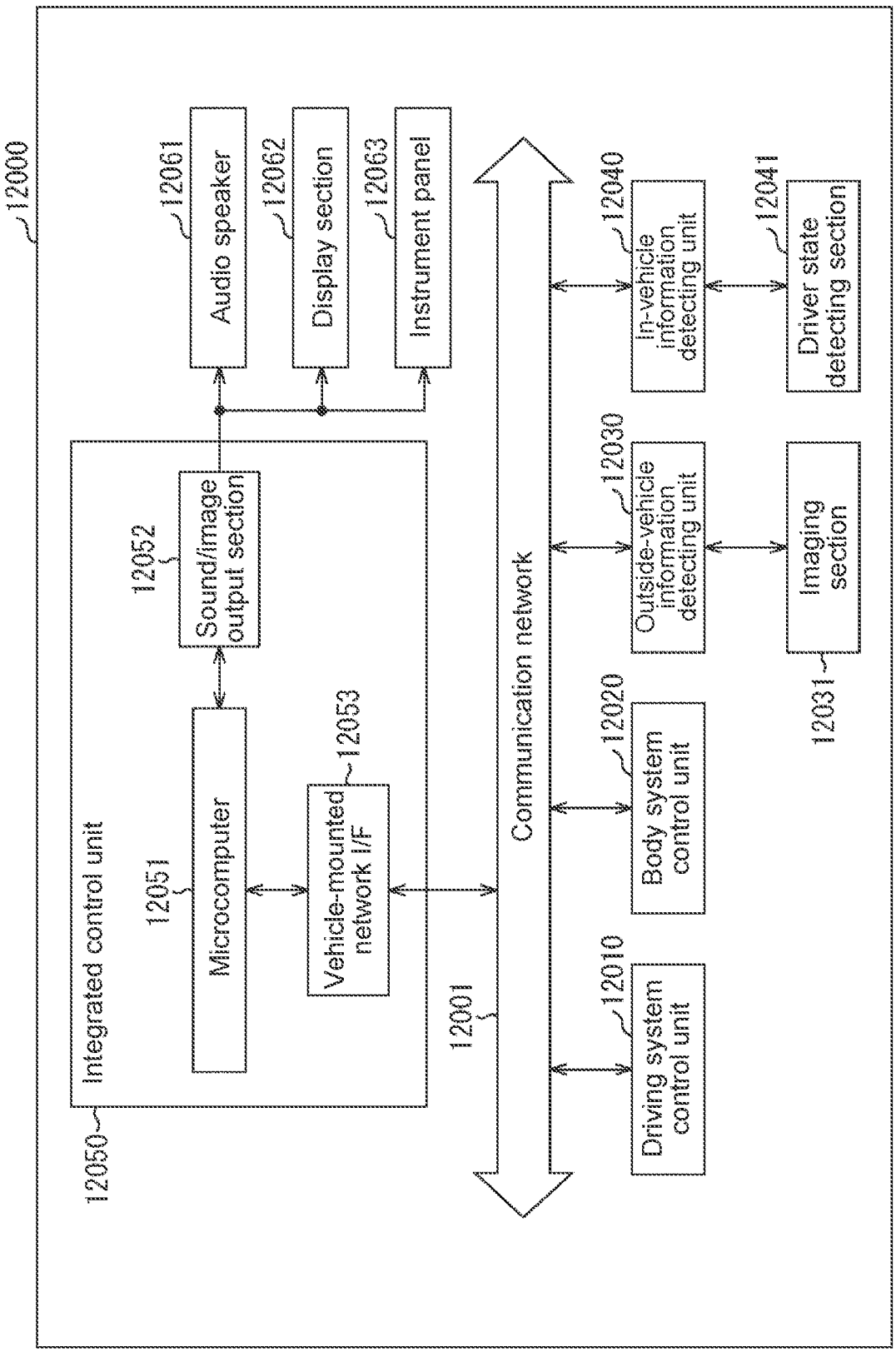
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

Figure 17:
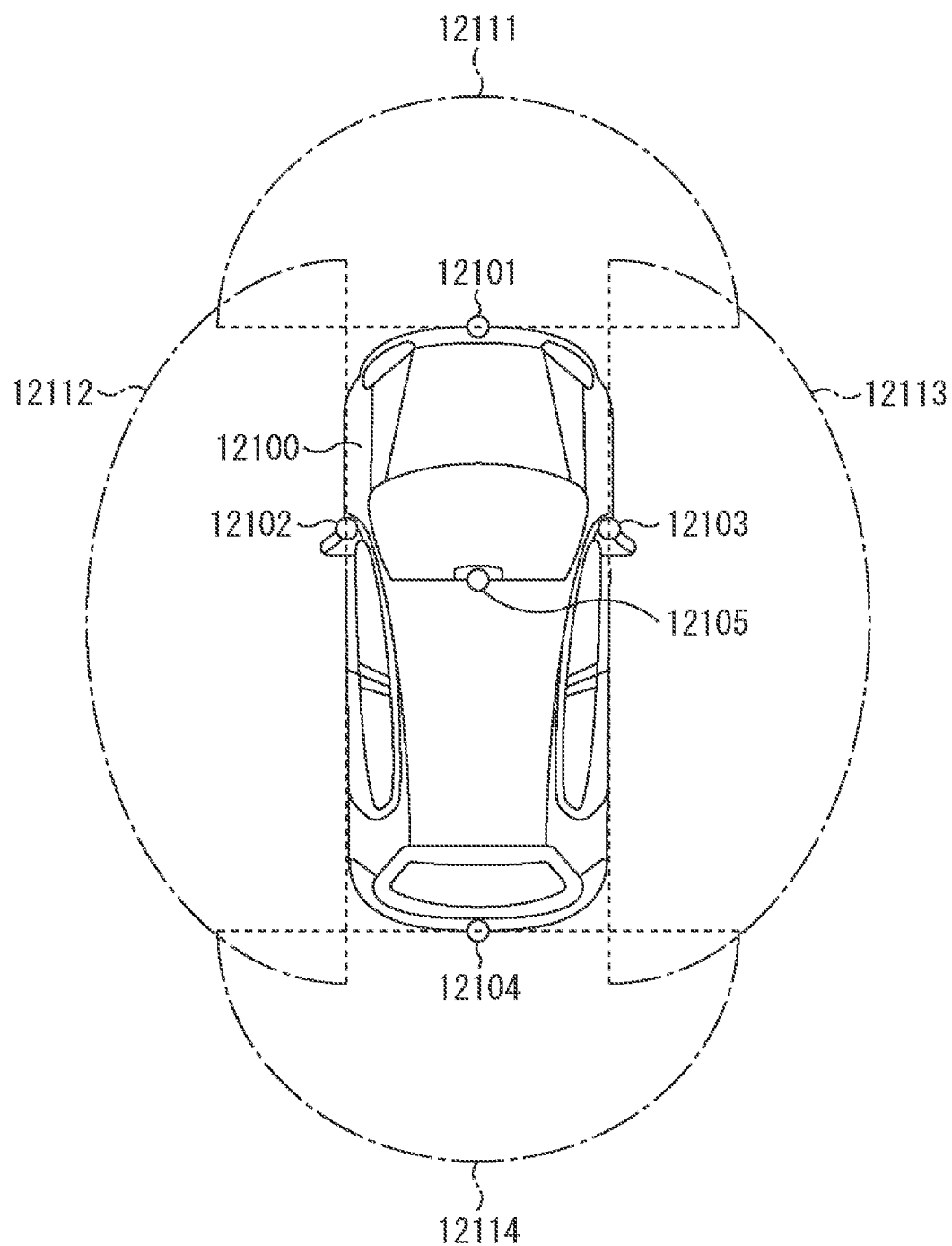
FIG. 17 is a diagram of assistance in explaining an example of installation positions of an outside-vehicle information detecting section and an imaging section.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As above, an example of the vehicle control system to which the technology according to the present disclosure is applicable is described. The technology according to the present disclosure is applicable to the imaging section 12031 of the above-described configurations. Specifically, the solid-state imaging apparatus 10 of FIG. 1 is applicable to the imaging section 12031. By applying the technology according to the present disclosure to the imaging section 12031, since a part of the SPAD pixels among the plurality of SPAD pixels arranged on the pixel array section is thinned at the time of the high illuminance for a predetermined unit (e.g., pixel unit, block unit, or divided Avalanche section unit), imaging can be performed at lower power consumption.

Note that the embodiments of the present technology are not limited to the above-described embodiments. Various modifications and alterations of the present technology may be available without departing from the spirit and scope of the present disclosure.

In addition, the present technology may have the following structures.

(1)
A solid-state imaging apparatus, including:
a pixel array section on which a plurality of SPAD (Single Photon Avalanche Diode) pixels is two-dimensionally arranged, in which
in a case where illuminance becomes first illuminance higher than reference illuminance, a part of the SPAD pixels of the plurality of pixels arranged on the pixel array section is thinned.

(2)
The solid-state imaging apparatus according to (1), in which
in the pixel array section, thinned pixels being the part of the SPAD pixels are thinned for a pixel unit or a block unit including the plurality of pixels.

(3)
The solid-state imaging apparatus according to (2), in which
the thinned pixels are arranged regularly or irregularly on the pixel array section for the pixel unit or the block unit.

(4) The solid-state imaging apparatus according to (1) or (2), in which
the thinned pixels are thinned by controlling a voltage of an anode or a cathode of each SPAD.

(5)
The solid-state imaging apparatus according to (1), in which
the SPAD pixels have a plurality of divided Avalanche sections of the SPADs and are thinned for each divided Avalanche section unit of the divided Avalanche sections.

(6)
The solid-state imaging apparatus according to (5), in which
each divided Avalanche section is thinned by controlling a voltage of an anode or a cathode.

(7)
The solid-state imaging apparatus according to (5), in which
each divided Avalanche section is thinned by controlling a gate electrode arranged at an upper part of the divided Avalanche section.

(8)
The solid-state imaging apparatus according to (7), further including:
an overflow drain for discharging unnecessary electrons for each divided Avalanche section.

(9)
The solid-state imaging apparatus according to any of (1) to (8), in which
a potential difference between the anode and the cathode of the SPAD is controlled for each thinned pixel of the part of the SPAD pixels by using a relationship to an Avalanche probability.

(10)
The solid-state imaging apparatus according to any of (1) to (9), in which
the illuminance is classified into a plurality of stages including the first illuminance depending on a reference threshold value.

(11)
The solid-state imaging apparatus according to (10), in which
the illuminance is classified into two stages of the first illuminance and a second illuminance lower than the first illuminance depending on the threshold value.

(12)
The solid-state imaging apparatus according to (10), in which
the illuminance is classified into three stages of the first illuminance, a second illuminance lower than the first illuminance, and a third illuminance lower than the second illuminance depending on the threshold value.

(13)
The solid-state imaging apparatus according to any of (1) to (12), in which
in the SPAD of the SPAD pixels,
an anode is formed at a side of a first surface that is a light incident surface or at a side of a second surface opposite to the first surface, and
a cathode is formed at a side of the second surface or a side of the first side.

(14) A driving method of a solid-state imaging apparatus including a pixel array section on which a plurality of SPAD pixels is two-dimensionally arranged, including:
in a case where illuminance becomes first illuminance higher than reference illuminance, thinning a part of the SPAD pixels of the plurality of pixels arranged on the pixel array section.

REFERENCE SIGNS LIST

10 solid-state imaging apparatus
21 the pixel array section
22 control circuit
23 readout circuit
100 SPAD pixel
110 single photon Avalanche photodiode (SPAD)
111 anode
112, 112-1 to 112-4 cathode
121 transistor
122 transistor
131 Avalanche section
131-1 to 131-4 divided Avalanche section
141-1 to 141-4 gate electrode
142-1 to 142-4 overflow drain
1000 electronic device
1001 solid-state imaging apparatus
12031 imaging section

The invention claimed is:
1. A light detecting device, comprising:
a plurality of avalanche photodiodes arranged in a two-dimensional array, including a first avalanche photodiode and a second avalanche photodiode;

a first transistor coupled to an anode or a cathode of the first avalanche photodiode; and
a second transistor coupled to an anode or a cathode of the second avalanche photodiode,
wherein, in a first mode, the first transistor is in an ON state and the second transistor is in an ON state,
wherein, in a second mode, the first transistor is in the ON state and the second transistor is in an OFF state,
wherein the plurality of avalanche photodiodes are disposed at a side of a first surface of a semiconductor substrate that is a light incident surface, and the anode or the cathode of the first avalanche photodiode and the anode or the cathode of the second avalanche photodiode are disposed at a side of a second surface opposite to the first surface, and
wherein the light detecting device is configured to switch between the first mode and the second mode according to an amount of incident light.

2. The light detecting device according to claim 1, wherein the light detecting device is configured to switch from the first mode to the second mode in a case where the amount of incident light exceeds a predetermined threshold.

3. A light detecting device comprising:
a plurality of avalanche photodiodes arranged in a two-dimensional array, including a first avalanche photodiode and a second avalanche photodiode;
a first transistor coupled to an anode or a cathode of the first avalanche photodiode; and
a second transistor coupled to an anode or a cathode of the second avalanche photodiode,
wherein, in a first mode, the first transistor is in an ON state and the second transistor is in an ON state,
wherein, in a second mode, the first transistor is in the ON state and the second transistor is in an OFF state,
wherein the plurality of avalanche photodiodes are disposed at a side of a first surface of a semiconductor substrate that is a light incident surface, and the anode or the cathode of the first avalanche photodiode and the anode or the cathode of the second avalanche photodiode are disposed at a side of a second surface opposite to the first surface,
wherein, in a third mode, the first transistor is in an OFF state and the second transistor is in the OFF state,
wherein the light detecting device is configured to switch from the first mode to the second mode in a case where the amount of incident light exceeds a first predetermined threshold, and
wherein the light detecting device is configured to switch from the second mode to the third mode in a case where the amount of incident light exceeds a second predetermined threshold larger than the first predetermined threshold.

4. The light detecting device, comprising:
a plurality of avalanche photodiodes arranged in a two-dimensional array, including a first avalanche photodiode and a second avalanche photodiode;
a first transistor coupled to an anode or a cathode of the first avalanche photodiode; and
a second transistor coupled to an anode or a cathode of the second avalanche photodiode,
wherein, in a first mode, the first transistor is in an ON state and the second transistor is in an ON state,
wherein, in a second mode, the first transistor is in the ON state and the second transistor is in an OFF state,
wherein the plurality of avalanche photodiodes are disposed at a side of a first surface of a semiconductor substrate that is a light incident surface, and the anode or the cathode of the first avalanche photodiode and the anode or the cathode of the second avalanche photodiode are disposed at a side of a second surface opposite to the first surface,
wherein the two-dimensional array includes a first block having an n=n subset of the plurality of avalanche photodiodes including the first avalanche photodiode, and a second block having an m=m subset of the plurality of avalanche photodiodes including the second avalanche photodiode, and
wherein n and m are integers greater than one.

5. The light detecting device according to claim 1, wherein the anode or the cathode of the first avalanche photodiode and the anode or the cathode of the second avalanche photodiode are constituted by a shared electrode.

6. The light detecting device according to claim 1, further comprising a control circuit configured to output a signal to a gate of the second transistor, thereby to switch the second transistor between the ON state and the OFF state.

7. The light detecting device according to claim 6, wherein the control circuit is configured to determine whether an amount of incident light exceeds a predetermined threshold.

8. The light detecting device according to claim 7, further comprising:
an illuminance sensor configured to detect the amount of incident light,
wherein the control circuit is configured to determine whether the amount of incident light exceeds the predetermined threshold based on an output of the illuminance sensor.

9. The light detecting device according to claim 7, wherein the control circuit is configured to determine whether the amount of incident light exceeds the predetermined threshold based on an output image of the light detecting device.

10. The light detecting device according to claim 1, further comprising a color filter array disposed over the plurality of avalanche photodiodes.

11. The light detecting device according to claim 10, wherein the color filter array includes red color filters, blue color filters, and green color filters arranged in a Bayer arrangement pattern.

12. A distance sensor comprising the light detecting device according to claim 1, wherein the distance sensor is configured to measure a distance based on a time of flight method.

13. A distance sensor comprising the light detecting device according to claim 3, wherein the distance sensor is configured to measure a distance based on a time of flight method.

14. A distance sensor comprising the light detecting device according to claim 4, wherein the distance sensor is configured to measure a distance based on a time of flight method.

* * * * *